United States Patent [19]
Itri

[11] Patent Number: 5,256,980
[45] Date of Patent: Oct. 26, 1993

[54] FREQUENCY SYNTHESIZER INCORPORATING VERNIER PHASE ADJUSTER

[75] Inventor: Benedict A. Itri, Huntington Beach, Calif.

[73] Assignee: PairGain Technologies, Inc., Calif.

[21] Appl. No.: 727,642

[22] Filed: Jul. 9, 1991

[51] Int. Cl.$^5$ .................. H03B 19/00; H03K 5/13
[52] U.S. Cl. ........................................ 328/104; 328/155
[58] Field of Search ............ 328/14, 155; 307/529; 377/47, 52

[56] References Cited

U.S. PATENT DOCUMENTS

| | | | |
|---|---|---|---|
| 3,958,186 | 5/1976 | Jesse et al. | 328/183 |
| 4,234,929 | 11/1980 | Riley, Jr. | 328/15 |
| 4,490,688 | 12/1984 | Borras et al. | 328/155 |
| 4,893,094 | 1/1990 | Herold et al. | 331/1 A |
| 5,128,632 | 7/1992 | Erhard et al. | 331/1 A |

*Primary Examiner*—Jin F. Ng
*Assistant Examiner*—Sinh Tran
*Attorney, Agent, or Firm*—Freilich Hornbaker Rosen

[57] ABSTRACT

A frequency synthesizer for producing an output whose phase and/or frequency can be finely adjusted under digital control. The synthesizer utilizes a phase lock loop including a phase detector responsive to a prescale divide-by-N frequency divider and a feedback divide-by-M frequency divider to product an output signal $F_{OUT}$. The phase of $F_{OUT}$ can be shifted by a small increment by slightly adjusting the values of the divisors M and N.

15 Claims, 7 Drawing Sheets

FREQUENCY SYNTHESIZER INCORPORATING VERNIER PHASE ADJUSTER

FIELD OF THE INVENTION

This invention relates to electronic frequency synthesizers and more particularly to improvements therein for producing an output signal whose phase can be finely adjusted, preferably under digital control.

BACKGROUND OF THE INVENTION

Frequency synthesizers are widely used for producing output signals of specified frequencies. A typical implementation uses a phase lock loop (PLL) to generate a specific output frequency $F_{OUT}$ from a reference input frequency $F_{IN}$. This type of loop is sometimes called an indirect frequency synthesizer and generally includes a phase detector (PD) whose output drives a voltage controlled oscillator (VCO) which produces the output signal $F_{OUT}$. A first input F1 to the phase detector is derived from a prescale frequency divider (divisor=N) driven by the reference frequency input $F_{IN}$. A second input F2 to the phase detector is derived from a feedback frequency divider (divisor=M) driven by the output $F_{OUT}$. The phase detector generates an output proportional to the phase difference between the two inputs. When the loop is locked, the two inputs are identical in frequency and phase, and the phase detector output is constant; i.e. F1=F2 and $F_{OUT}=F_{IN}(M/N)$.

U.S. Pat. No. 4,234,929 entitled Control Device for a Phase Lock Loop Vernier Frequency Synthesizer describes a device utilizing two simple phase lock loops. Each loop produces a frequency equal to $N \times f_{ref}$ (where $f_{ref}$ is respectively shown as f1 and f2). The overall vernier synthesizer produces an output frequency that can be varies in steps of f1-f2.

SUMMARY OF THE INVENTION

The present invention is directed to a frequency synthesizer for producing an output whose phase can be finely adjusted, preferably under digital control. More specifically, the present invention is directed to a phase lock loop frequency synthesizer incorporating vernier phase adjusting means for finely adjusting output phase. Output phase is adjusted in accordance with the invention by selectively incrementing or decrementing frequency divider divisor values used to generate the phase detector inputs.

In accordance with a preferred embodiment, a phase lock loop frequency synthesizer includes a phase detector responsive to a prescale divide-by-N frequency divider and a feedback divide-by-M frequency divider to produce an output signal $F_{OUT}$. The phase of $F_{OUT}$ can be shifted by a small increment by slightly adjusting the values of the divisors M and N. For example, the values of M and N can be selectively incremented to shift the phase of $F_{OUT}$ in a first direction or decremented to shift the phase in an opposite direction.

In accordance with a preferred embodiment, each frequency divider comprises a binary counter which can be selectively programmed to overflow at its nominal modulus (e.g., n) or at a count one above or below the nominal modulus (.e., n−1 or n+1).

In accordance with the preferred embodiment, a prescale modulo-N counter responds to a reference input of frequency $F_{IN}$ to produce a first phase detector input of frequency F1 where F1 equals $F_{IN}/N$ where N selectively equals n or n−1 or n+1. A feedback modulo-M counter responds to the output signal of frequency $F_{OUT}$ to produce a second phase detector input of frequency F2 where F2 equals $F_{OUT}/M$ where M selectively equals m or m−1 or m+1.

In accordance with a significant aspect of the preferred embodiment, the modulo-N and modulo-M counters can be selectively controlled during each counter cycle to overflow at their nominal moduli (i.e., n, m) or at modulii one above (i.e., n+1, m+1) or one below (i.e., n−1, m−1) the nominal moduli.

In accordance with a further aspect of the preferred embodiment, the divisor values are selectively set on a cycle by cycle basis, preferably under digital control by a microprocessor or other digital control circuit. This action permits minute phase shifts to be made in a fixed frequency output $F_{OUT}$, for example, on the order of a few thousandths of one cycle of $F_{OUT}$.

In accordance with a further feature of the invention, by continuously shifting the phase over successive counter cycles, the output frequency $F_{OUT}$ can be offset so as to be slightly higher or lower than the nominal output frequency, depending upon whether the phase is shifted in a positive or negative direction. This feature is useful in applications requiring digital control of a tuned frequency with extremely high precision.

DETAILED DESCRIPTION

Figure 1:
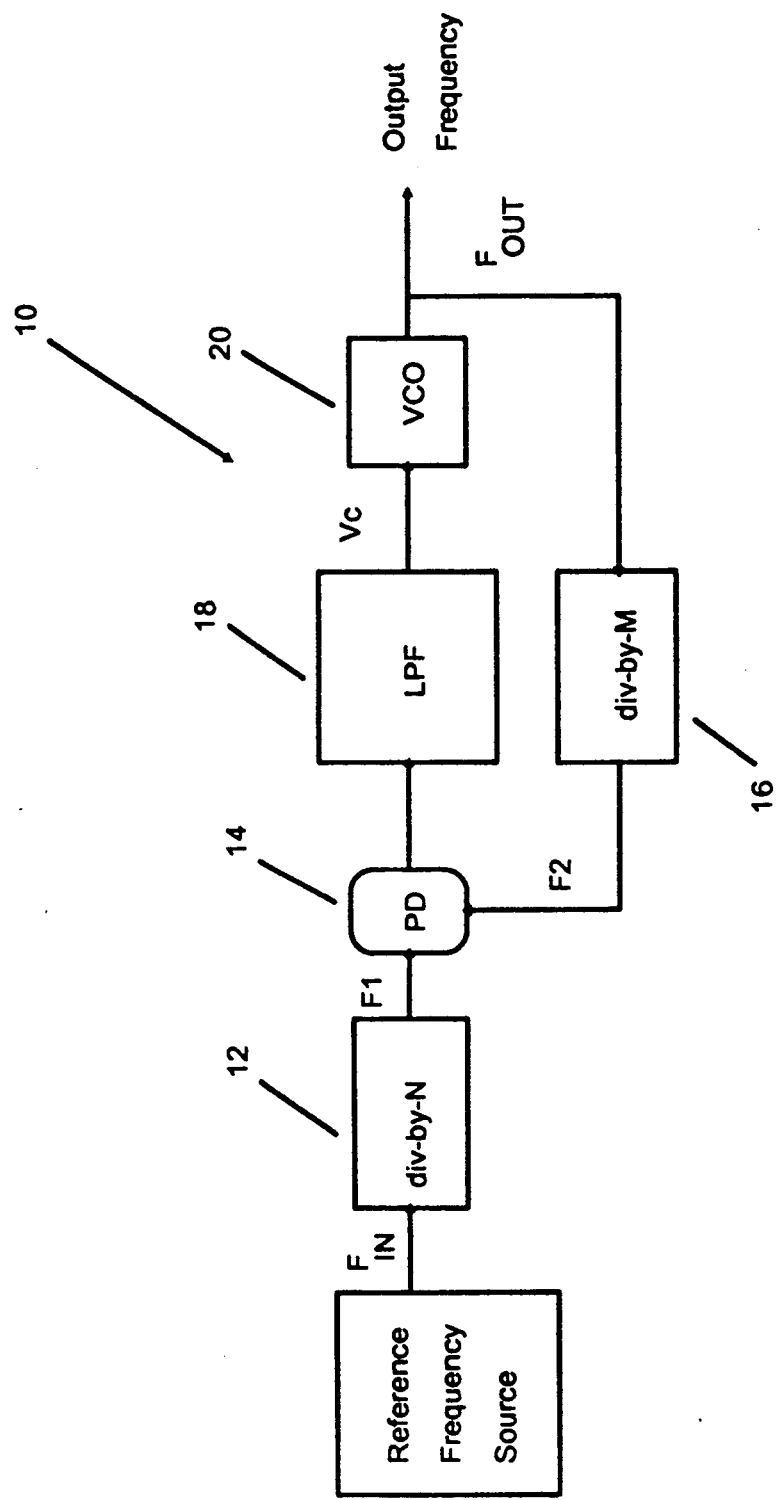
FIG. 1 is a block diagram of a typical prior art phase lock loop frequency synthesizer.

Attention is initially directed to FIG. 1 which depicts a typical prior art phase lock loop (PLL) frequency synthesizer 10 for generating a periodic output signal of frequency $F_{OUT}$ from a periodic reference input of frequency $F_{IN}$. The input drives a prescale divide-by N circuit 12 which produces a signal $F1 = F_{IN}/N$ which is applied to one input of a phase detector (PD) 14. A second input F2 is derived from a feedback divide-by-M circuit 16 driven by the output $F_{OUT}$, where $F2 = F_{OUT}/M$. The phase detector output is passed through low pass filter (LPF) 18 to produce control signal Vc for driving a voltage controlled oscillator (VCO) 20 which produces output signal $F_{OUT}$. When the loop is locked, F1 and F2 are equal in frequency and phase, and $F_{OUT}=F_{IN}(M/N)$. Circuits of the type depicted in FIG. 1 can be designed to yield outputs of virtually any frequency, limited primarily by the availability of an appropriate reference frequency input source and precise dividers 12, 16. Such circuits, however, lack any convenient means for offsetting the output frequency $F_{OUT}$ or precisely shifting its phase by small amounts.

Figure 2A:
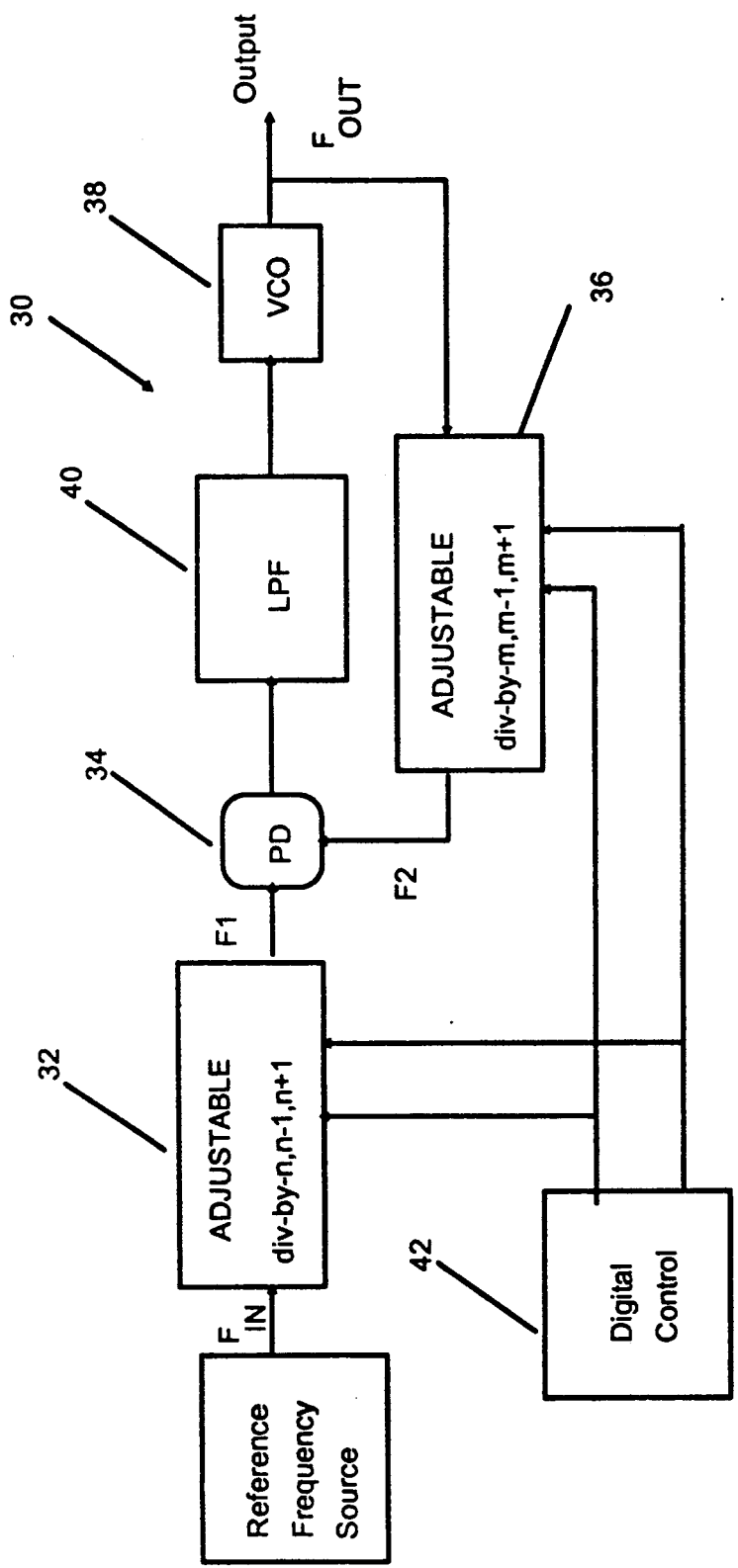
FIG. 2A is a block diagram of a basic frequency synthesizer in accordance with the invention incorporating vernier phase adjusting means.

The present invention is directed to a frequency synthesizer, as depicted in FIG. 2A, incorporating vernier phase adjuster means for selectively shifting the phase of the output $F_{OUT}$ in minute steps, i.e. $1/F_{IN} - 1/F_{OUT}$, which can be on the order of thousandths of a cycle of $F_{OUT}$ under digital control. The term "vernier" is used by analogy to a mechanical vernier caliper which has a resolution equal to the difference between the spacings of the graduations on two scales. In embodiments of the present invention, phase shift resolution is determined by the difference between two periodic signals F1 and F2 applied as inputs to a phase detector.

FIG. 2A depicts a frequency synthesizer 30 in accordance with the invention including an adjustable divide-by-N circuit 32, where N is selectively adjustable, under digital control, to equal either its nominal value n or a decremented or incremented value, respectively n−1 or n+1. The divider circuit 32 responds to an applied reference input of frequency $F_{IN}$ to produce signal F1 where $F1 = F_{IN}/N$, which is applied as a first input to phase detector 34. A second input F2 is produced by adjustable divide-by-M circuit 36, where M is selectively adjustable to equal either its nominal value m or a decremented or incremented value, respectively, m−1 or m+1, responsive to an output of frequency $F_{OUT}$. Output $F_{OUT}$ is produced by voltage controlled oscillator 38 responsive to signal Vc supplied by phase detector 34 via low pass filter 40. As will be discussed in greater detail in connection with FIG. 3A, the dividers 32,36 are responsive to shift commands from digital controller 42 which determine their divisor values, and thus the direction of $F_{OUT}$ shift, e.g. in accordance with the following table, which assumes that m>n:

| PHASE SHIFT COMMAND | DIVISOR |
|---|---|
| NO SHIFT | n,m, (nominal cycle) |
| RETARD | n+1,m+1 (long cycle) |
| ADVANCE | n−1,m−1 (short cycle) |

Figure 2B:
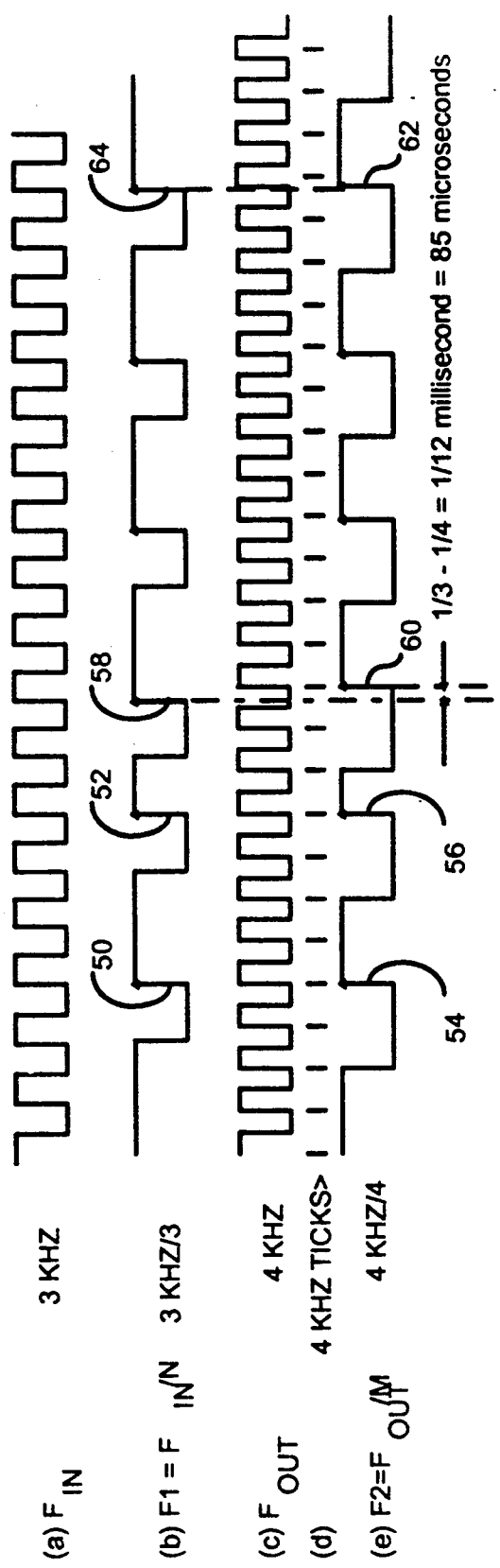
FIG. 2B is a timing diagram depicting the vernier phase adjustment operation of the basic synthesizer of FIG. 2A.

Attention is now directed to FIG. 2B which generally depicts the operation of the phase lock loop circuit of FIG. 2A. As an example, assume that $F_{IN}=3KHZ$ (line (a)) and that the nominal divisor values N and M are respectively three and four. When the loop is locked, $F_{OUT}$ will equal 4KHZ (line (c)) and F1 and F2 will each equal 1KHZ (lines (b) and (e)). Note that F1 initially has rising edges 50 and 52 spaced by three rising edges of $F_{IN}$. Note also that F2 initially has rising edges 54 and 56 spaced by four rising edges of $F_{OUT}$.

Now consider the effect of adjusting the divisor values N and M to two and three, respectively. This produces in F1 a rising edge 58 one cycle (of $F_{IN}$, line (a)) earlier than normal and similarly in F2 a rising edge 60 one cycle (of $F_{OUT}$, LINE (c)) earlier than normal. The resulting difference, i.e. $1/F_{IN} - 1/F_{OUT}$, or phase error, causes the phase detector 34 to slightly increase the oscillator 38 frequency $F_{OUT}$ until the offset between F1 and F2 is resolved. That is, the dynamics of the phase lock loop normally serve to keep the rising edges of F1 and F2 in time alignment. Resolution of the phase error is shown in FIG. 2B as being resolved over the next three cycles of the phase detector, (i.e. between rising edges 60 and 62) though in practice, it is preferable to design the loop to have a much smoother and slower response. For clarity, 4KHZ "tick" marks are shown in line (d) underneath the representation of $F_{OUT}$ to mark the original phase of the clock prior to the shift. The small resulting phase shift of $F_{OUT}$ can then be seen at the right of FIG. 2B where the rising edge 62 of F2 has become realigned with a rising edge 64 of F1.

When the N counter 32 is short cycled, (i.e. n−1) the phase of the output frequency is advanced by a period of time equal to $1/F_{IN}$. When the M counter is short cycled (i.e. m−1), the phase of the output frequency is retarded by a period of time equal to $1/F_{OUT}$. By short cycling both counters simultaneously, the net phase shift advance on a short cycle is:

$$\text{phase advance (short cycle)} = 1/F_{IN} - 1/F_{OUT}$$

The counter can be similarly retarded by the same time interval by inserting a single long cycle in each counter. Note that the finest resolution is achieved when n=m−1 or n=m+1, i.e. when $F_{IN}$ is close in value to $F_{OUT}$.

If $F_{OUT}$ is greater than $F_{IN}$, then short cycling the counters results in a net advance of the output phase, i.e., an increase in frequency. If $F_{OUT}$ is less than $F_{IN}$, then the phase is retarded and the frequency is decreased. The duration of the phase shift can be seen to be:

$$\frac{1}{F_{IN}} - \frac{1}{F_{OUT}} = \qquad (1)$$

$$\frac{1}{F_{IN}} - \frac{1}{F_{IN}(M/N)} = \qquad (2)$$

$$\frac{1 - N/M}{F_{IN}} \qquad (3)$$

For $F_{IN}=3KHZ$, N=3 and M=4, the phase shift of $F_{OUT}$ equals $$\frac{1}{3 \text{ KHZ}} - \frac{1}{4 \text{ KHZ}} = \frac{1}{12 \text{ KHZ}} = 85 \text{ microseconds}$$

The phase shift of $F_{OUT}$ can also be expressed in radians as:

$$\text{Phase Shift} = F_{OUT}(1/F_{IN} - 1/F_{OUT})$$

This is a small time shift in comparison to the much lower speed frequencies used in the circuit. This small time resolution can be made even smaller by increasing the values of divisors M and N.

Figure 3A:
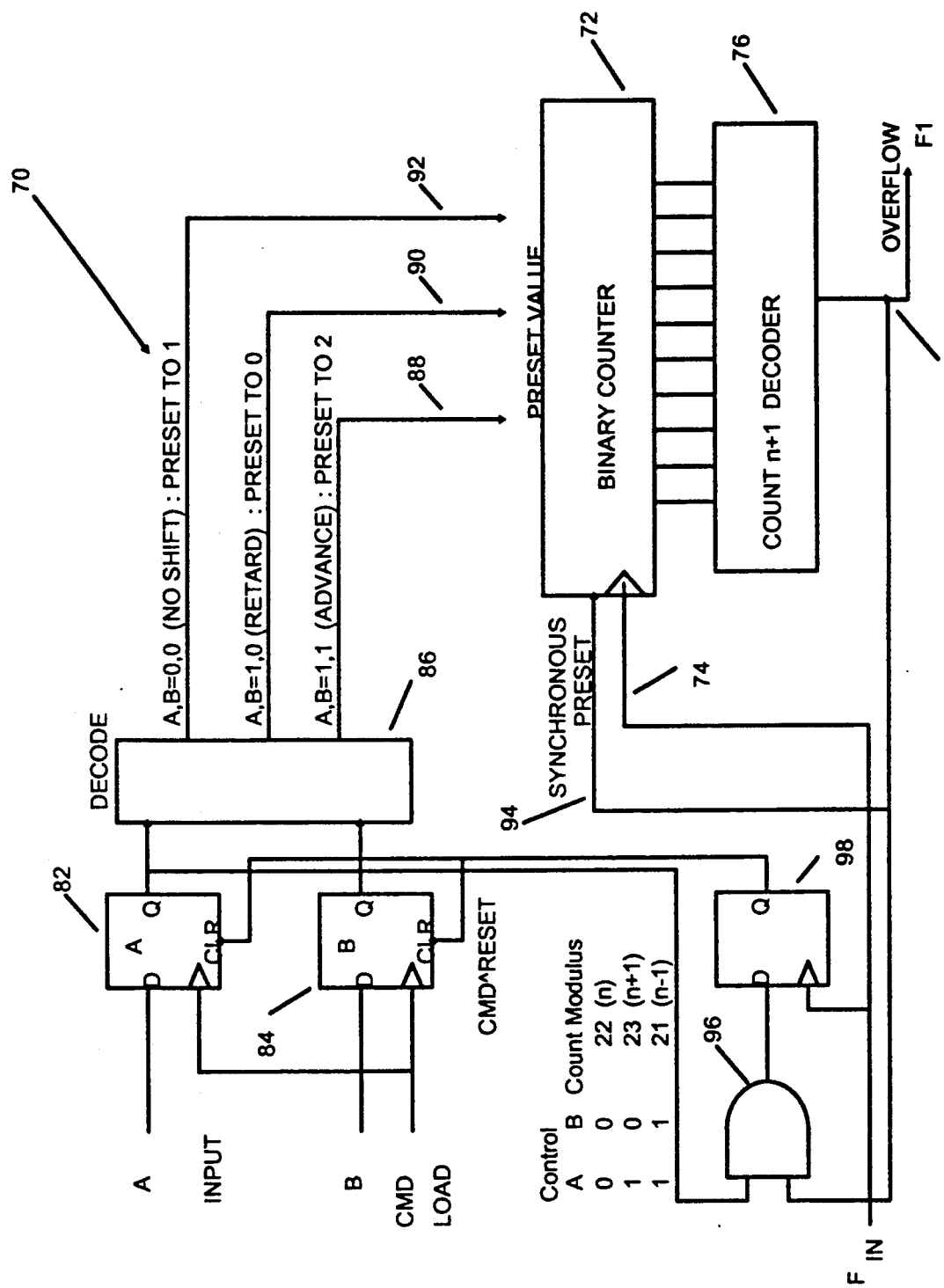
FIG. 3A is a block diagram depicting a preferred divider circuit useful in the frequency synthesizer of FIG. 2A.

Attention is now directed to FIG. 3A which depicts a preferred implementation 70 of the adjustable divider circuit 32 in synthesizer 30 of FIG. 2A. Divider 36 can be similarly implemented. The implementation 70 includes a binary counter 72 for counting rising edges of $F_{IN}$ applied to its clock input terminal 74. A count decoder 76 provides an overflow pulse on terminal 78 when the count in counter 72 reaches n+1.

At the beginning of each cycle of counter 72, it is preset concurrent with the occurrence of the overflow pulse on terminal 78, in accordance with the following table:

| COMMAND | | | | |
|---|---|---|---|---|
| A | B | PHASE SHIFT | DIVISOR/CYCLE | PRESET |
| 0 | 0 | NO SHIFT | n/nominal | 1 |
| 1 | 0 | RETARD | n+1/long | 0 |

| COMMAND | | | | |
|---|---|---|---|---|
| A | B | PHASE SHIFT | DIVISOR/CYCLE | PRESET |
| 1 | 1 | ADVANCE | n−1/short | 2 |

More particularly, as depicted in FIG. 3A, command bits A and B from digital controller 42 are loaded into flip flops 82, 84 in response to a command load pulse (CMD LOAD). Decoder 86 is responsive to flip flops 82,84 to one of three preset inputs 88,90,92 to the counter 72. The enabled input then presets counter 72, concurrent with the next overflow pulse from decoder 76, applied to the counter synchronous preset terminal 94.

The overflow pulse from decoder 76 is also applied to the input of AND gate 96. The true (Q) outputs of flip-flops 82,84 are logically OR'ed together (not shown) and applied as the second input to AND gate 96. The output of gate 96 is coupled to the data input of flip flop 98 which is clocked by $F_{IN}$. The true output of flip flop 98 is connected to the clear (CLR) inputs of flip flops 82 and 84.

Thus, each overflow pulse 78 from decoder 76 will cause counter 72 to be preset in accordance with a prior shift command (i.e. A,B) entered into flip flops 82,84 and will additionally clear flip flops 82,84 at the next $F_{IN}$ rising edge, to prepare them for receipt of a subsequent controller command. This operation is depicted by the wave forms of FIG. 3B and allows the divisor value N to be adjusted on a cycle by cycle basis to introduce small phase shifts into $F_{OUT}$.

Figure 3B:
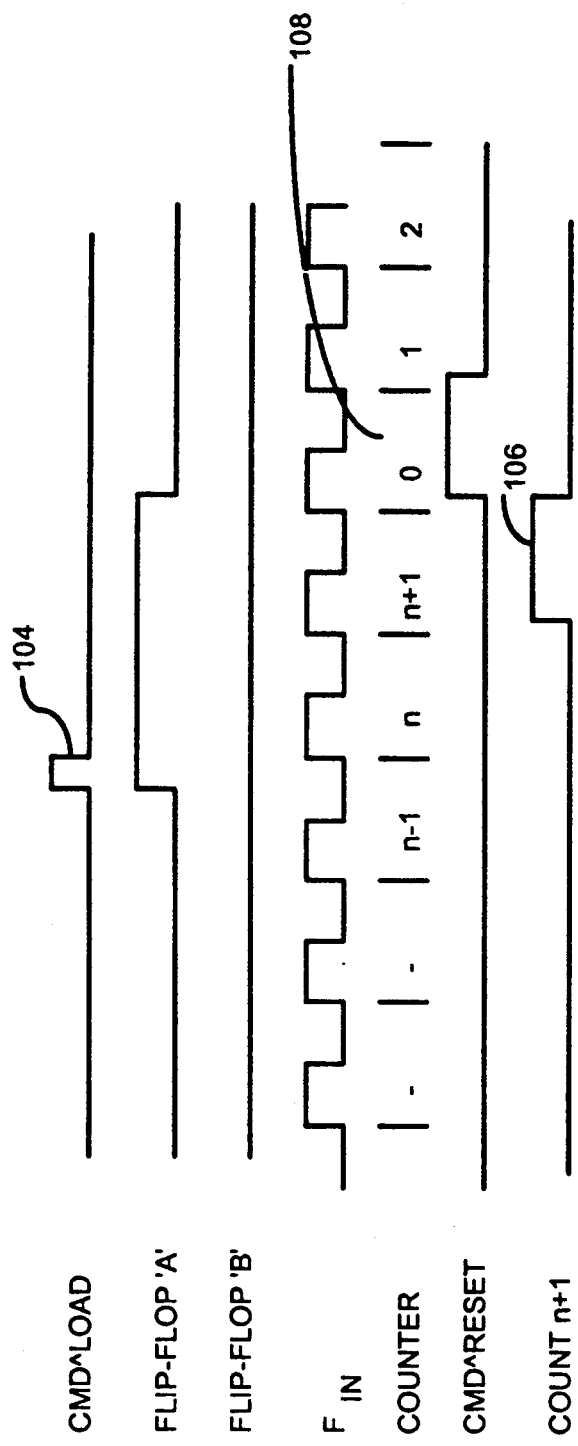
FIG. 3B is a timing diagram depicting the operation of the divider circuit of FIG. 3A.

As an example, FIG. 3B illustrates operation when the RETARD (A=1,B=0) command is executed. Note that when the depicted CMD LOAD pulse 104 occurs, flip-flops A(82) and B(84) are respectively set to 1 and 0. When the count n+1 pulse 106 occurs to initiate the succeeding counter cycle, the counter 72 is preset in accordance with the content of flip-flops 82,84; in this case to count 0, depicted at 108. If, on the other hand, the digital controller 42 presented a NO SHIFT command (A=0, B=0), the counter would be preset to 1, or if an ADVANCE command (A=1, B=1) is presented, the counter would be preset to 2. The CMD_RESET pulse which appears synchronously with the presetting of the counter clears the A and B flip-flops and assures that each command loaded by CMD_LOAD is executed only once. The rate of CMD_LOAD pulses inserting n−1 and n+1 commands must be less than the reload rate of the binary counter, so that no commands are missed.

As a further practical example of an application of the synthesizer of FIG. 2A, assume it is desired to generate an output of $F_{OUT}$ equal to 10.500 MHZ from a reference input of $F_{IN}$ equal to 10.000 MHZ and that the output is to be phase adjustable by some digital controller such as a microprocessor. Inasmuch as the greatest common denominator is 500 KHZ, nominal divisor values of m=21 and n=20 can be selected.

When the modulus of the M counter is slipped, i.e. to m+1 or m−1, its output F2 shifts by 1/10.500 MHZ equals 95.24 nanoseconds. When the modulus of the N counter is slipped, i.e. to n+1 or n−1, its output F1 shift by 1/10.000 MHZ equals 100 nanoseconds. This results in a net phase difference at the phase detector of (100.00−95.24) or 4.76 nanoseconds. This corresponds to a shift of 0.05 radians or 2.86 degrees. The phase lock loop will then shift the output $F_{OUT}$ by this amount to achieve lock with F1 and F2 in phase. The low pass filter functions to distribute the 4.76 nanosecond shift over several cycles to produce a smooth transition.

Figure 4:
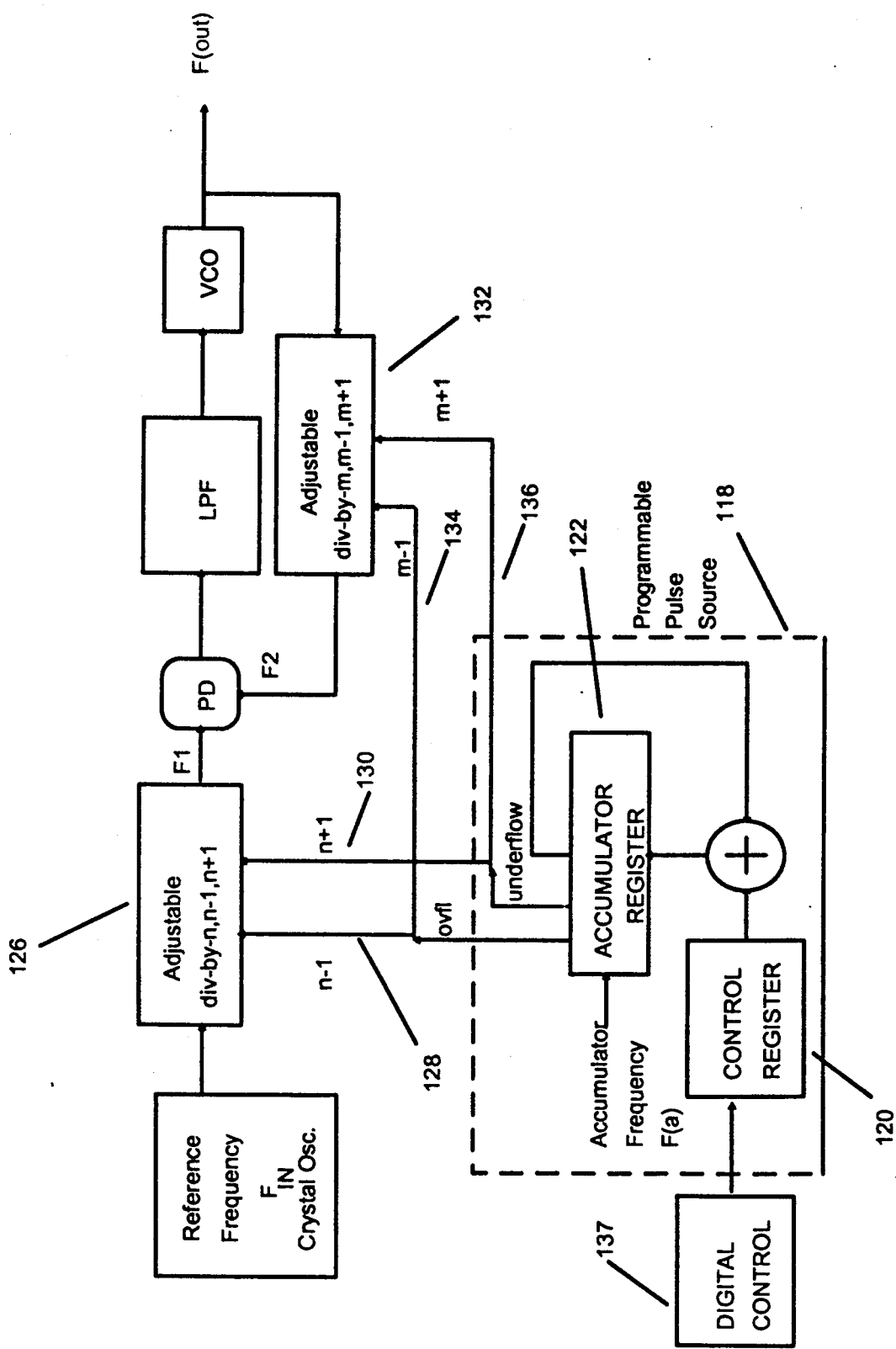
FIGS. 4 and 5 comprise block diagrams of frequency synthesizers in accordance with the invention respectively intended for applications as (1) a digitally controlled frequency source and (2) a vernier phase adjusted frequency source.

Attention is now directed to FIG. 4 which depicts the basic frequency synthesizer of FIG. 2A being controlled by a programmable pulse source 118 comprised of control register 120 and accumulator 122. This configuration allows the output frequency $F_{OUT}$ to be determined by a numeric value entered into control register 120 and finds application as a digitally controlled frequency source.

For simplicity, the adjustable divide-by-N circuit 126 is shown as having two inputs 128, 130 which can be respectively directly pulsed to insert a short cycle (n−1) or a long cycle n+1). Similarly, the divide-by-M circuit 132 is shown as having two inputs 134, 136 which can be respectively directed pulsed to insert short (m−1) or long (m+1) cycles.

In order to understand the operation of the frequency source of FIG 4, first consider the effect on F1 when the divider 126 is adjusted to either n−1 and n+1; i.e. F1=($F_{IN}$−C)/N, where C represents the number of clocks deleted per second. Similarly, F2=($F_{OUT}$−C)/M.

By equating F1=F2, the output can be expressed as $$F_{OUT} = F_{IN} * M + C * (N-M)/N$$

Note that when C=0, the original equation $F_{OUT}=F_{IN}$ (M/N) is produced.

The programmable pulse source 118 generates overflow or underflow pulses to control dividers 126, 132 to thus control $F_{OUT}$. More particularly, the accumulator 122 is used to convert an input control word supplied by controller 137 to control register 120 into a series of RETARD or ADVANCE commands.

The magnitude of the control word, the clock rate of the accumulator and the size of the accumulator determine the overflow (underflow) rate according to the following relationship $$\text{overflow rate} = [F(a)*W]/2^{(B)}$$

Substituting the overflow rate of the accumulator into the expression for the output frequency $F_{OUT}$ gives:

$$F_{OUT} = \frac{F(a)*W*(N-M)}{N*2^{(B)}} + F(\text{out, nom})$$

where:
F(a)=accumulator clock rate
W=signed control word, Note that $[-2^{(B-1)}] < W < [2^{(B-1)}-1]$
B=word length of accumulator in bits The accumulator overflow rate must be less than the frequency of the loop phase detector, to avoid pulses being skipped. It is preferable to create F(1) by an integer divide of $F_{IN}$, or by clocking it with the phase detector clock. The frequency at the phase detector is not a constant, so the above equation is modified slightly when that approach is taken.

Figure 5:
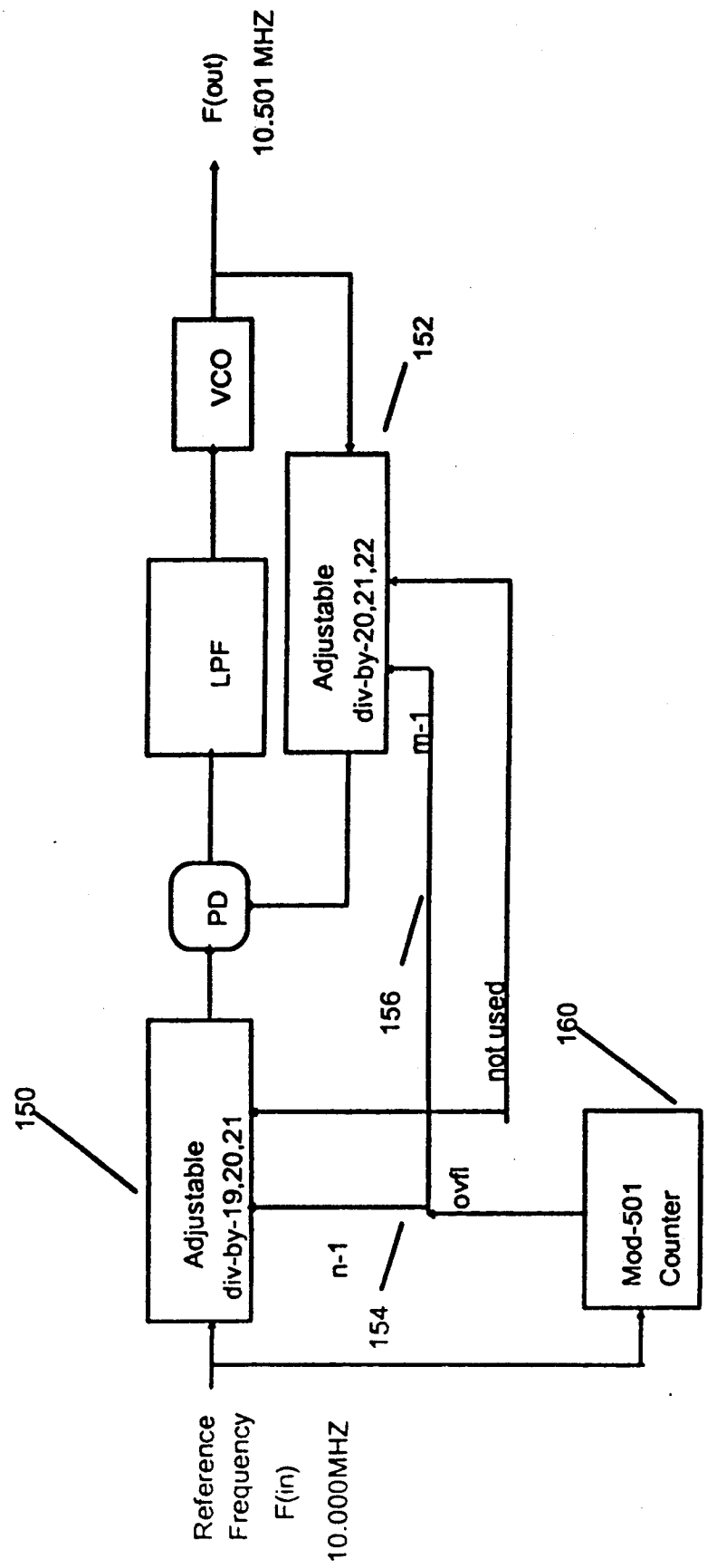

Attention is now directed to FIG. 5 which illustrates a further embodiment of the invention, comprising a vernier phase adjusted frequency source, particularly useful for generating a fixed output frequency $F_{OUT}$ from a reference input $F_{IN}$, where the greatest common denominator of the two frequencies is very small. The circuit of FIG. 5 allows an indirect frequency synthesizer to be constructed where the loop is closed at a phase detector frequency much higher than could be achieved with only a fixed M/N divide ratio. Closing the loop at a high frequency provides for faster lock times.

The circuit of FIG. 5 utilizes a divide-by-N divider 150, where N equals n or n−1, and a divide-by-M divider 152 where M equals m or m−1. Clock delete pulses can be applied to dividers 150, 152 via their input terminals 154, 156 respectively. The delete pulses are generated by dividing the reference frequency $F_{IN}$ by a constant value K, via counter 160. The nominal output frequency of $F_{OUT}$ can be derived as follows:

The time step which occurs at the phase detector when a single vernier step is executed is $$1/F_{OUT} - 1/F_{IN}$$

This is equivalent to $$\frac{(F_{IN} - F_{OUT})}{(F_{OUT} * F_{IN})} \text{ (seconds)}$$

If one vernier step per second is executed, the resulting output is shifted by some number of, or fractional part of an output clock. The previous expression could therefore be viewed as:

$$\frac{(F_{IN} - F_{OUT})}{(F_{OUT} * F_{IN})} \text{ (seconds of phase shift per vernier steps/second)}$$

By multiplying this expression by the output frequency $F_{OUT}$, the value remaining is $$\frac{(F_{IN} - F_{OUT})}{(F_{IN})} \text{ (HZ of frequency shift per vernier step/second)}$$

For instance, if the time advance were 1 microsecond per vernier step/second, and $$F_{OUT} = 1 \text{MHZ}$$

then the frequency change would be = 1MHZ * 1 microsecond = 1HZ

A modulo-K counter 160 clocked for the reference frequency $F_{IN}$ can be used to generate phase shift pulses to the counters 150, 152. If this is done, the number of the phase shift pulses executed per second is $$F_{IN}/K \text{ phase pulses per second}$$

where K is the count modulus of counter 160.

If this term is multiplied by the frequency shift per pulse, the final result is $$(F_{IN} - F_{OUT})/K \text{(HZ of frequency shift)}$$

FIG. 5 illustrates a particular example in which a 10.000 MHZ $F_{IN}$ reference is converted to a 10.501 MHZ output frequency $F_{OUT}$. Note that if the synthesizer were implemented with a simple indirect loop, this would have required a fixed divide-by-N circuit, where N = 10000 and a fixed divide-by-M circuit where M = 10501. The phase detector would be operating at only 1 KHZ.

Note that a) If n > m and n−1, m−1 cycles are inserted, the output frequency $F_{OUT}$ decreases.

b) if n < m and n−1, m−1 cycles are inserted, the output frequency $F_{OUT}$ increases.

c) If n > m and n+1, m+1 cycles are inserted, the output frequency $F_{OUT}$ increases.

d) if n < m and n+1, m+1 cycles are inserted, the output frequency $F_{OUT}$ decreases.

FIG. 5, following expression (b) above, implements the loop with nominal divide-by-20 and divide-by-21 counters 150, 152 that can be slipped respectively to a count modulus of 19 and 20.

To determine the count modulus of the modulo-K counter 160, the earlier derived expression can be evaluated; i.e.

$$(F_{IN} - F_{OUT})/K \text{(HZ of frequency shift)}$$
$$10000 \text{ KHZ} - 10501 \text{ KHZ}/K = -1 \text{KHZ}$$

therefore: K = Notice that the vernier shift is not symmetrical. If the intent of the loop were to operate at 10.499 MHZ, expression (d) would have been implemented, and modulo-21 and modulo-22 respectively cycles would have been inserted with a modulo-499 counter in lieu of the illustrated modulo-501 counter 160.

From the foregoing, it should now be clear that frequency synthesizer embodiments have been disclosed herein which can be digitally controlled to finely adjust the phase of the synthesizer output and/or its frequency. The embodiments are characterized by the use of phase lock loops which utilize adjustable frequency dividers whose divisor values can be selectively incremented and/or decremented.

I claim:

1. A frequency synthesizer including means for previously adjusting the phase of a periodic output signal of frequency $F_{OUT}$, said synthesizer comprising:
   source means providing a periodic input signal of frequency $F_{IN}$;
   first divider means responsive to said input signal $F_{IN}$ for producing a signal of frequency F1 where $F1 = F_{IN}/N$;
   second divider means responsive to said output signal $F_{OUT}$ for producing a signal of frequency F2 where $F2 = F_{OUT}/M$;
   phase detector means responsive to said signals F1 and F2 for producing a control signal $V_c$;
   oscillator means for producing said output signal $F_{OUT}$ as a function of said signal Vd; and
   phase adjusting means for selectively temporarily simultaneously incrementing the values of M and N to shift the phase of said output signal in one direction or decrementing the values of M and N to shift the phase of said output signal in an opposite direction, while maintaining said output signal frequency $F_{OUT}$ fixed.

2. The synthesizer of claim 1 wherein said first divider means comprises a first cyclic counter means for counting N cycles of said signal $F_{IN}$ and wherein said phase adjusting means selectively sets N equal to n or n−1 or n+1 during each first counter means cycle; and wherein
   said second divider means comprises a second cyclic counter means for counting M cycles of said signal $F_{OUT}$ and wherein said phase adjusting means selectively sets M equal to m or m−1 or m+1 during each second counter means cycle.

3. The synthesizer of claim 2 including controller means for selectively generating a first command or a second command; and wherein said phase adjusting means is responsive to said first command to set M=m−1 and N=n−1 and to said second command to set M=m+1 and N=n+1.

4. The synthesizer of claim 3 wherein said phase adjusting means is responsive to said first command for presetting said first and second counter means to a first count and responsive to said second command for presetting said first and second counter means to a second count.

5. The synthesizer of claim 1 wherein N=M+1 or M−1.

6. The synthesizer of claim 3 wherein said controller means generates a selected command during each counter means cycles to either ADVANCE or RETARD the phase of said output signal.

7. The synthesizer of claim 3 wherein said controller means repeatedly generates the same command during successive counter means cycles to offset said frequency $F_{OUT}$ in either a first or second direction.

8. In a phase lock loop frequency synthesizer including controllable oscillator means for providing an output signal of frequency $F_{OUT}$, phase detector means for producing an oscillator control signal Vc, prescale divide-by-N means responsive to a periodic reference signal of frequency $F_{IN}$ for producing a first phase detector input signal of frequency F1 wherein $F1=F_{IN}/N$, and feedback divide-by-M means responsive to said output signal for producing a second phase detector input signal of frequency F2 where $F2=F_{OUT}/M$, an improvement for finely shifting the phase of said output signal in steps equal to $1/F_{IN}-1/F_{OUT}$ while maintaining the frequency of said output signal fixed said improvement comprising:

phase adjusting means for selectively temporarily simultaneously setting the values of N and M to either (1) n and m, to maintain the phase of said output signal, (2) n−1, and m−1 to advance the phase of said output signal, or (3) n+1 and m+1 to retard the phase of said output signal, respectively.

9. The frequency synthesizer of claim 8 wherein said prescale means comprises first counter means for counting N states and said feedback means comprise second counter means for counting M states;

means for incrementing said first counter means in response to each cycle of said reference signal; and means for incrementing said second counter means in response to each cycle of said output signal.

10. The frequency synthesizer of claim 9 wherein said first and second counter means responsively comprise modulo n+1 and modulo m+1 counters; and wherein said phase adjusting means comprises means for selectively presetting said second counter means during each cycle to counts of 0 or 1 or 2.

11. The synthesizer of claim 10 including shift control means for selectively generating either a first shift command, a no shift command or a second shift command; and wherein said phase adjusting means is responsively responsive to said first shift command for presetting said first and second counter means to said 0 count, to said second shift command for presetting said first and second counter means to said 2 count, and to said no shift command for presetting said first and second counter means to said 1 count.

12. The synthesizer of claim 8 wherein N=M+1 or M−1.

13. A method of shifting the phase of an output signal of frequency $F_{OUT}$, produced in response to a reference signal of frequency $F_{IN}$, by an oscillator controlled y a phase detector responsive to first and second input signals of frequency F1 and F2, respectively, where $F1=F_{IN}/N$ and $F2=F_{OUT}/M$, comprising the steps of:

defining nominal values of N and M, respectively; and concurrently incrementing or decrementing said nominal values of N and M to respectively retard or advance the phase of said output signal while maintaining the frequency of said output signal fixed.

14. The method of claim 13 including the further step of periodically repeating said step of concurrently incrementing or decrementing said values of N and M to offset said frequency $F_{OUT}$.

15. The method of claim 13 wherein said step of defining nominal values of N and M includes the step of establishing N=M+1 or M−1.

* * * * *